US012674817B2

(12) United States Patent
Zhao et al.

(10) Patent No.: US 12,674,817 B2
(45) Date of Patent: Jul. 7, 2026

(54) TEST FIXTURE AND EARLY WARNING SYSTEM

(71) Applicant: TRIPLE WIN TECHNOLOGY(SHENZHEN) CO.LTD., Shenzhen (CN)

(72) Inventors: Ying-Quan Zhao, Shenzhen (CN); Cheng-An Lin, New Taipei (TW); Yu-Tsang Tu, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 396 days.

(21) Appl. No.: 18/213,857

(22) Filed: Jun. 25, 2023

(65) Prior Publication Data
US 2024/0329079 A1 Oct. 3, 2024

(30) Foreign Application Priority Data
Mar. 29, 2023 (CN) .......................... 202310351197.2

(51) Int. Cl.
*G01R 1/04* (2006.01)
*G01R 1/073* (2006.01)
*G01R 1/44* (2006.01)
*G01R 31/28* (2006.01)

(52) U.S. Cl.
CPC ....... *G01R 1/0408* (2013.01); *G01R 1/07307* (2013.01); *G01R 1/44* (2013.01); *G01R 31/2831* (2013.01)

(58) Field of Classification Search
CPC .... G01R 1/07307; G01R 1/44; G01R 1/0408; G01R 31/2831
See application file for complete search history.

(56) References Cited

U.S. PATENT DOCUMENTS

2016/0103152 A1* 4/2016 Yang .................... G01R 1/0441
324/756.02
2023/0131189 A1* 4/2023 Kiyokawa .......... G01R 31/2867
324/750.2
2023/0228808 A1 7/2023 Shin et al.

FOREIGN PATENT DOCUMENTS

CN 107167723 A 9/2017
CN 110031748 A 7/2019
TW 202146906 A 12/2021

OTHER PUBLICATIONS

Translation of CN 106383309 A (Year: 2017).*
Translation of CN 101685133 B (Year: 2008).*
Translation of JP H03252572 A (Year: 1991).*

* cited by examiner

*Primary Examiner* — Paresh Patel
(74) *Attorney, Agent, or Firm* — ScienBiziP, P.C.

(57) ABSTRACT

A test fixture includes a fixed base for placing a module and probes. The fixed base defines threading needle holes, and the threading needle holes communicate with a surface of the fixed base adjacent to the module. The probes are connected with a tester and extend through the threading needle holes to contact with the module placed on the fixed base. The tester is capable of testing the module. When the module is disposed on the fixed base, the probes are directly connected with the module for testing, a gilded block between the module and the probes is omitted for improving a stability and an accuracy of test results. An early warning system is also disclosed.

17 Claims, 12 Drawing Sheets

41                                    4

TEST FIXTURE AND EARLY WARNING SYSTEM

FIELD

The subject matter herein generally relates to test fixture technology.

BACKGROUND

While manufacturing an electronic module and a specific process for manufacturing or assembling is completed, functions of the semi-finished electronic module need to be tested for determining whether the semi-finished electronic module is satisfied with a specific requirement. For example, after a camera module being assembled, specific features of the camera module need to be tested, such as impedance, electric conductivity, and resistivity, or the function of the camera module needs to be tested by powering the camera module through an interface port of the camera module.

While testing the function of the modules, a test fixture is provided. The test fixture is a mechanism assisting device for testing the functions. The test fixture usually includes a base, a probe, a gilded block, and a tester. The gilded block is mounted on the base, and the probe is fixed on the base. An end of the probe is contacted with the gilded block, another end of the probe is connected with the tester. In using, the module is disposed on the gilded block, and a to-be-tested portion of the module is directly connected with the gilded block. For example, while testing the impedance of the module with a steel, the module is disposed on the gilded block in a direction for making the steel to face to the gilded block, based on the conductivity of the gilded block, a circuit is formed between the tester, the probe, the gilded block, and the steel for testing the impedance of the module.

However, according to the increasing of the using time, the resistance of the gilded block may be changed when being mechanical worn and being oxidized, a testing accuracy of the test fixture is reduced.

There is room for improvement in the art.

BRIEF DESCRIPTION OF THE DRAWINGS

Implementations of the present disclosure will now be described, by way of example only, with reference to the attached figures.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Terms "first", "second", and the like used in the specification, the claims, and the accompanying drawings of the present disclosure are used to distinguish different objects rather than describe a particular order. A term "comprise" and its variations are intended to cover a non-exclusive inclusion. For example, a process, method, system, product, or apparatus including a series of steps or units is not limited to the listed steps or units, and may optionally include other steps or units that are not listed, or other steps or units inherent to the process, method, product, or device.

Figure 1:
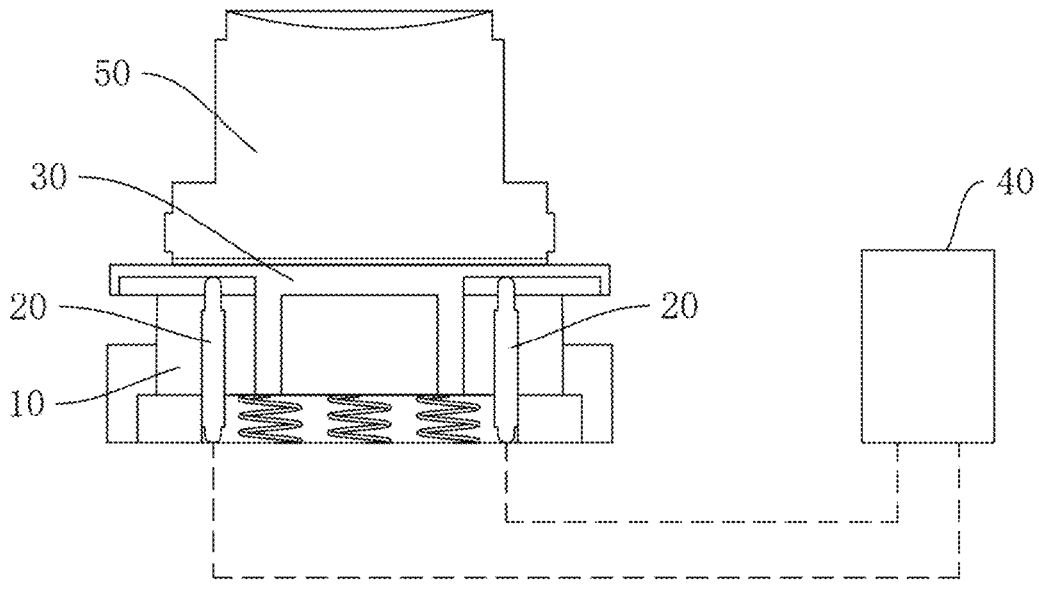
FIG. 1 is a cross-sectional diagram illustrating an embodiment of a test fixture in a related art.

Referring to FIG. 1, in a related art, a test fixture generally includes a base body 10, a probe 20, a gilded block 30, and a tester 40. The gilded block 30 is mounted on the base body 10, and the probe 20 is fixed on the base body 10. An end of the probe 20 contacts with the gilded block 30, another end of the probe 20 is connected with the tester 40. While testing a module 50, the module 50 is disposed on the gilded block 30 for testing features.

For example, in a test for testing an impedance of the module 50, the probe 20 is generally a 4-wired probe structure, which includes two pairs of probes 20. A to-be-tested portion of the module 50 is a steel on the bottom of the module 50. The module 50 is disposed on the gilded block 30 in a direction for making the steel to face to the gilded block 30. The probes 20 are connected with different positions of the gilded block 30 for distancing from each other in a specific distance. A pair of the probes 20 is used to test a current, and another pair of the probes 20 is used to test a voltage. Based on the tested current and voltage, the impedance of the module 50 can be calculated.

Figure 2A:
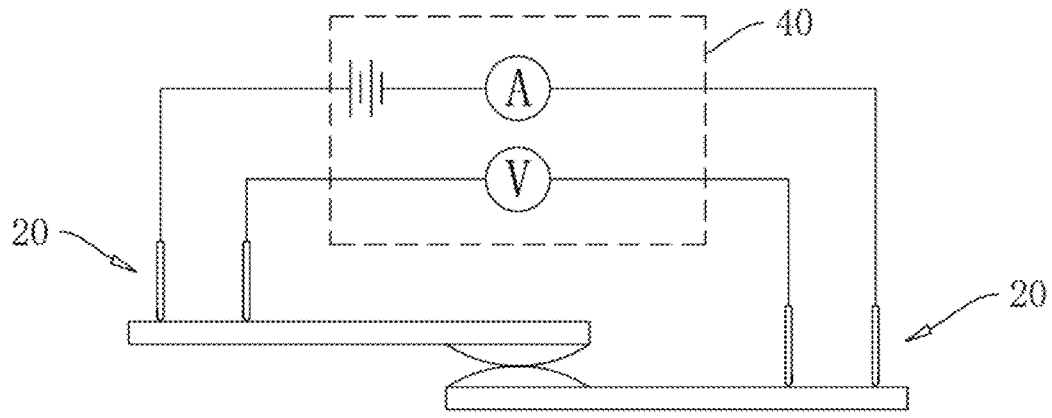
FIGS. 2A-2B are diagrams illustrating an embodiment of the test fixture of FIG. 1 in a circuit connection state during testing in the relate art.

In an ideal condition, the impedance of the gilded block 30 remains in an allowable and lower range based on a gilded layer of the gilded block 30. A connection state between the probe 20 and the tester 40 is formed as shown in FIG. 2A.

Figure 2B:
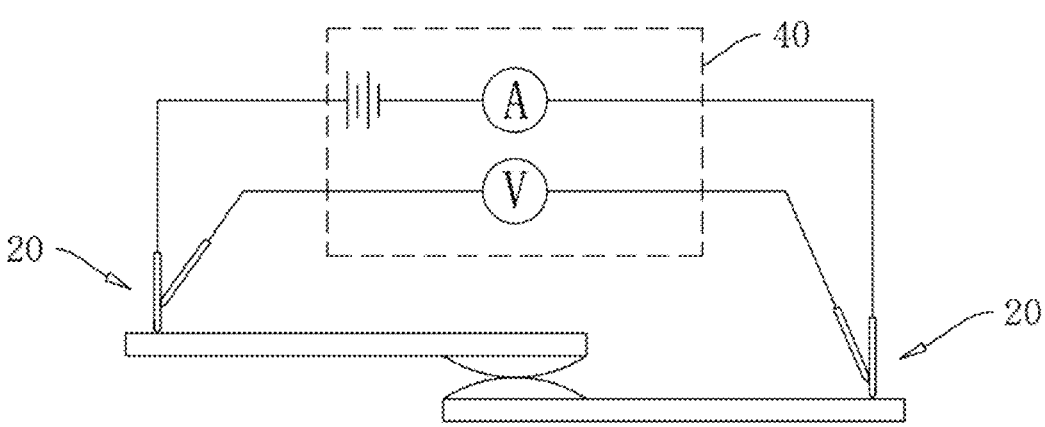

According to the increasing of the testing times, the mechanical connection between the gilded block 30 and different assemblies 50 becomes more, and the gilded block 30 is oxidized, the resistance of the gilded block 30 is changed. When the resistance of the gilded block 30 exceeds the allowable range, a short circuit may occur between the probes 20. The connection state between the probe 20 and the tester 40 is formed as shown in FIG. 2B. The test result of the test fixture deviates from actual value, a testing stability of the test fixture is poor, and a testing accuracy of the test fixture is reduced.

Figure 3:
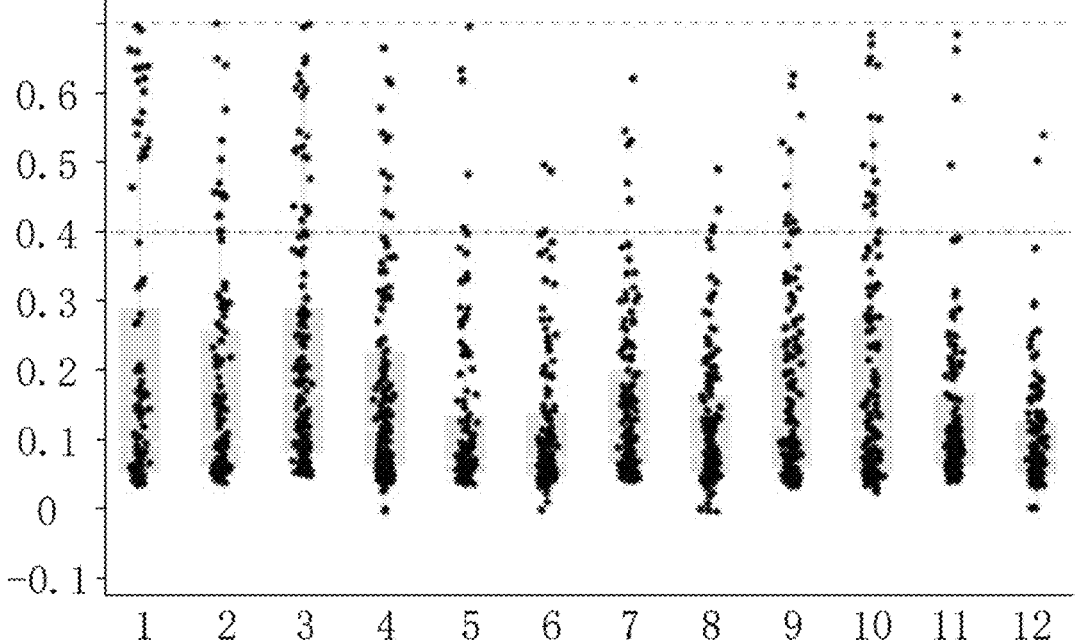
FIG. 3 is a diagram illustrating an embodiment of a test result of the test fixture of FIG. 1 in the relate art.

FIG. 3 shows the test result of the test fixture with the gilded block 30 in the related art. Number of the test fixture serves as X-axis, and there are 12 test fixtures. Impedance of the test result serves as Y-axis. Each test fixture tests the impedance of a same module 50 for several times. As shown in FIG. 3, the impedances in the test result are discrete distribution, which reflects the testing stability of the test fixture to be poor.

Thus, the present application provides a test fixture for improving the testing stability and the testing accuracy.

The present disclosure is described with reference to accompanying drawings and the embodiments. It will be understood that the specific embodiments described herein are merely part of all embodiments, not all the embodiments. Based on the embodiments of the present disclosure, it is understandable to a person skilled in the art, any other embodiments obtained by persons skilled in the art without creative effort shall all fall into the scope of the present disclosure. It will be understood that the specific embodiments described herein are merely some embodiments and not all.

Some embodiments of this application are described in detail below with reference to the accompanying drawings. In absence of conflicts, the following embodiments and features in the embodiments may be combined.

The present disclosure provides a test fixture. The test fixture is used to test specific features of a module, especially, physical tests are provided for testing the module, such as impedance test, electric conductivity test, and resistivity test.

Figure 4:
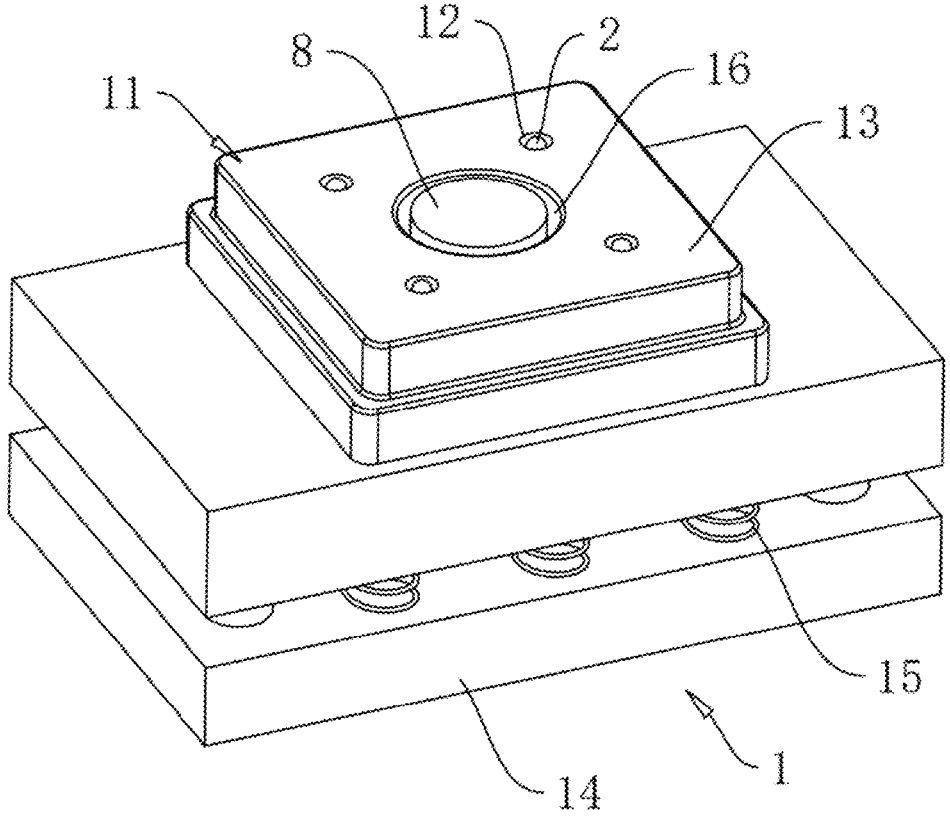
FIG. 4 is a diagram illustrating an embodiment of a test fixture according to the present disclosure.
Figure 5:
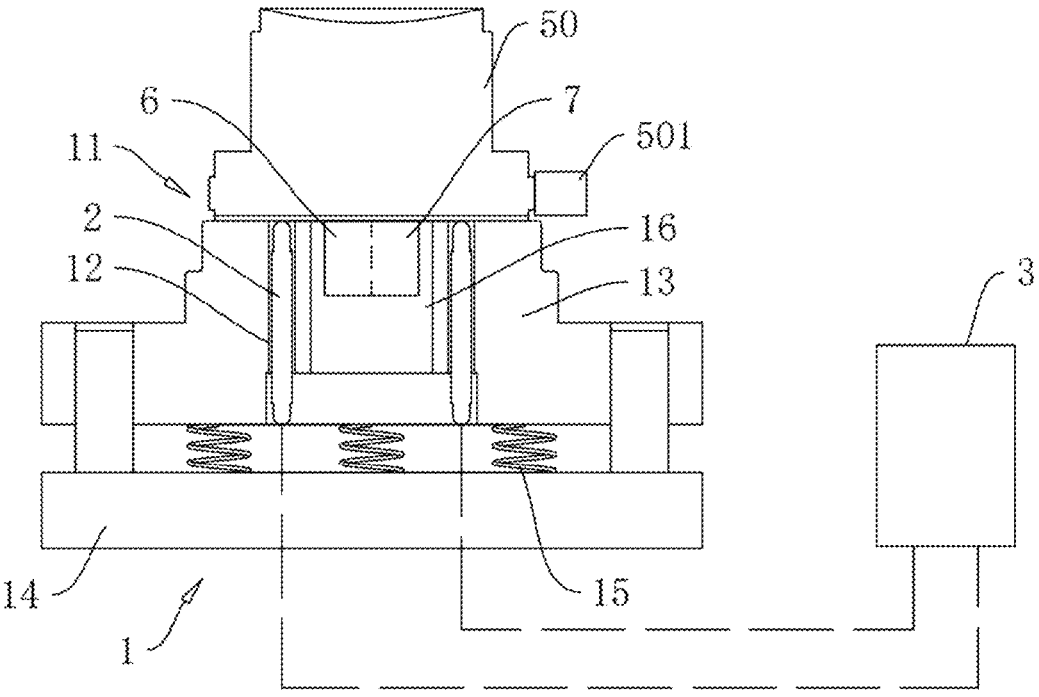
FIG. 5 is a cross-sectional diagram illustrating an embodiment of the test fixture of FIG. 4 according to the present disclosure.

Referring to FIGS. 4 and 5, the test fixture includes a fixed base 1, probes 2, and a tester 3. The fixed base 1 is used to dispose a module 50, the probes 2 connect with the tester 3 and is fixed on the fixed base 1. When the module 50 is disposed on the fixed base 1, the probes 2 connect with a surface of the module 50, for making the tester 3 to test the module 50 and obtain test results.

In one embodiment, the module 50 may be a camera module, a bottom of the module 50 includes a steel, which is used for testing an impedance. The module 50 further includes a interface connector 501, which is fixed on a side of the module 50. When the interface connector 501 is powered, the module 50 is lighted to work. In an impedance test, the module 50 is disposed on the fixed base 1 in a direction of the bottom of the module to be faced down, thus the probes 2 directly connect with the steel, a circuit is formed between the steel, the probes 2, and the tester 3 while testing, thus the tester 3 is capable of testing the impedance of the module 50.

In detail, an upper portion of the fixed base 1 includes a test position 11. The module 50 is disposed on the test position 11 while testing. For decreasing an unstable displacement of the module 50 caused by an intervening structure between a bottom surface of the module 50 and a surface of the fixed base 1, the bottom surface of the module 50 is matched with a top surface of the fixed base 1. For example, when the bottom surface of the steel in the module 50 is parallel to a horizontal direction, the top surface of the fixed base 1 also is parallel to the horizontal direction.

The fixed base 1 defines threading needle holes 12 for mounting the probes 2. An upper end of the threading needle hole 12 communicates with a surface of the fixed base 1 being close to the test position 11. That is, the threading needle holes 12 communicates the surface of the fixed base 1 being close to the module 50. In one embodiment, the number of the probes 2 is larger than 2, and a distance is defined between any two of the probes 12. There is a one-to-one relationship between the number and positions between the threading needle holes 12 and the probes 12.

Each probe 2 is fixed in a corresponding threading needle hole 12, and a top end of the probe 2 is exposed from the threading needle hole 12. When the module 50 is disposed on the test position 11, the top end of the probe 2 extends through the threading needle hole 12 to directly connect with the module 50.

It is understood that the test fixture includes different number of the probes 2 and the testers 3 due to different test projects. The present application uses the impedance test (also called DCR test) as an example for illustrating.

Each probe 2 is a 4-wired test probe, the number of the probes 2 is 4, and there is a distance between any two of the probes 2. The probes 2 includes a pair of first probes 201 and a pair of second probes 202. The tester 3 includes a current test module and a voltage test module. The pair of the first probes 201 are electrically connected with a positive end and a negative end of the current test module by wires, the pair of the second probes are electrically connected with a positive end and a negative end of the voltage test module by wires.

Figure 6:
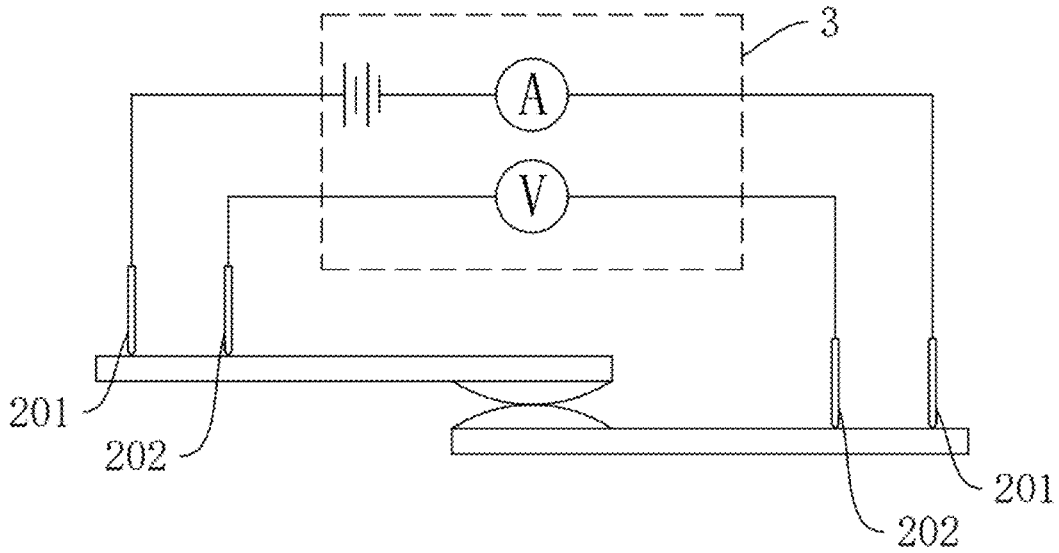
FIG. 6 is a diagram illustrating an embodiment of the test fixture of FIG. 4 in a circuit connection state during testing according to the present disclosure.

Referring to FIGS. 5 and 6, when the module 50 is disposed on the test position 11, each first probe 201 and each second probe 202 are connected with the module 50, the first probes 201 and the current test module are used to test the current of the module 50, the second probes 202 and the voltage test module are used to test the voltage of the module 50, the impedance of the module is calculated based on the current and the voltage of the module 50. Thus, the test result of the tester 3 includes the current, the voltage, and the impedance of the module 50.

In one embodiment, the probe 2 is an elastic probe with a telescopic function. The bottom end of the probe 2 is fixed on the fixed base 1. The top end of the probe 2 is a movable end and may be compassed at the threading needle hole 12. When the module 50 is not disposed at the test position 11, there is no blocking object or obstruction at an orifice of the threading needle hole 12, the top end of the probe 2 is stretched from the upper surface of the fixed base 1. When the module 50 is disposed at the test position 11, the module 50 compresses the top end of the threading needle hole 12, and the top end of the threading needle hole 12 is moved back in the orifice of the threading needle hole 12. Based on the telescopic function of the probe 2, in one hand, a connection stability between the probe 2 and the module 50 is ensured, and in another hand, a cushioning function is provided at the time of the module 50 connects with the probe 2 for reducing a damage to the probe 2 by the module 50.

Figure 7:
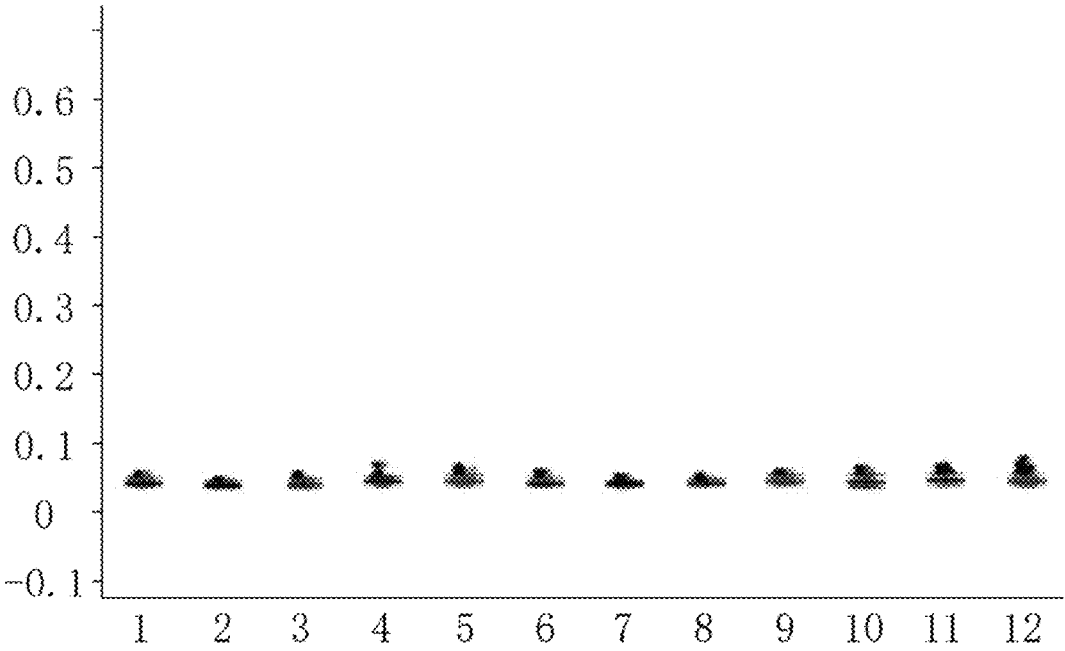
FIG. 7 is a diagram illustrating an embodiment of a test result of the test fixture of FIG. 4 according to the present disclosure.

Referring to FIG. 7, FIG. 7 shows a test result of the test fixture of the present disclosure. Number of the test fixture serves as X-axis, and there are 12 test fixtures. Impedance of the test result serves as Y-axis. Each test fixture tests the impedance of a same module 50 for several times. The impedances in the test result are concentrated distribution, which reflects the testing stability of the test fixture to be stable.

Referring to FIG. 5 again, in one embodiment, the fixed base 1 is made of heat dispersing material. Preferably, the fixed base 1 is made of cooper and aluminum composite materials. When the module 50 is disposed on the fixed base 1, the fixed base 1 can disperse the heat for reducing an effect of the heat generated by the lighted module 50 (being powered) on periphery electronic devices.

In one embodiment, the fixed base 1 is a divided structure, the fixed base 1 includes a heat dispersion block 13 and a base 14. The heat dispersion block 13 is mounted on the base 14. The heat dispersion block 13 is made of heat dispersing material. Preferably, the base 14 is made of cooper and aluminum composite materials. The threading needle hole 12 is disposed on the heat dispersion block 13, the test position 11 is disposed upon the heat dispersion block 13. The bottom end of the probe 2 is fixed on the base 14, and the top end of the probe 2 is extended through the threading needle hole 12.

In one embodiment, there are a plurality of heat dispersion blocks 13, which are matched with the base 14. Upper surfaces of the plurality of the heat dispersion blocks 13 are different from each other according to different modules 50, for making the heat dispersion blocks 13 to match with the modules 50 in different shapes. Before testing, the heat dispersion block 13 matched with the module 50 is selected and mounted on the base 14 for executing the testing. For example, when the bottom surface of the module 50 is a flat surface, the heat dispersion block 13 with a flat upper surface is selected. When the bottom surface of the module 50 is concave, the heat dispersion block 13 with a convex upper surface is selected.

In one embodiment, the fixed base 1 further includes elastic components 15. The elastic components 15 are preferably a spring. The heat dispersion block 13 is distanced from the base 14 and is in a slip connection with the base 14. The elastic component 15 are disposed between the heat dispersion block 13 and the base 14. The elastic components 15 support the heat dispersion block 13 for distancing the heat dispersion block 13 and the base 14 by an elastic force.

In some embodiments, for making the heat dispersion block 13 and the base 14 to slide along a specific direction, a limiting and guiding structure is provided. For example, the base 14 includes a limiting pole. The limiting pole passes through the heat dispersion block 13 and is in a slip connection with the heat dispersion block 13. In another example, there is a guiding rail mounted between the heat dispersion block 13 and the base 14.

Figure 8:
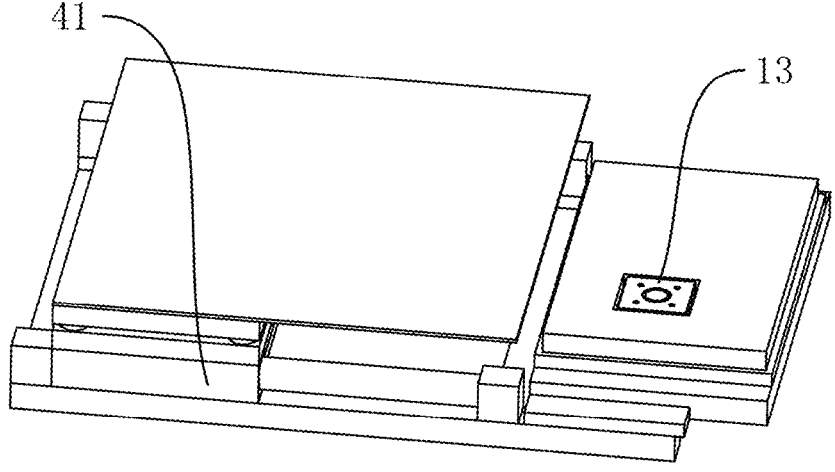
FIG. 8 is a diagram illustrating an embodiment of a first moving mechanical of the test fixture of FIG. 4 according to the present disclosure.

Referring to FIG. 8, in some test scenes, for making the module 50 to be steadily disposed on the heat dispersion block 13, a pressing device provides a pressure on the module from the top down to press the module 50 to be resisted with the heat dispersion block 13. Based on the pressure, the heat dispersion block 13 presses down, the distance between the heat dispersion block 13 and the base 14 is decreased, the elastic component is compressed. When the pressure disappears, the elastic component drives the heat dispersion block 13 to move back to the original position by the elastic force.

While a process of manufacturing, a manufacturing and testing environment is complex, particulate matters may be existed on a surface of the heat dispersion block 13, such as swarf. If the pressure is directly provided to the module 50 on the heat dispersion block 13, the module will be scratched by the particulate matters between the module 50 and the heat dispersion block 13. Based on a movable design between the heat dispersion block 13 and the base 14, a space for decline is provided for the module 50, for decreasing the scratch of the particulate matter to the module 50 the while the module 50 being pressed.

Figure 9:
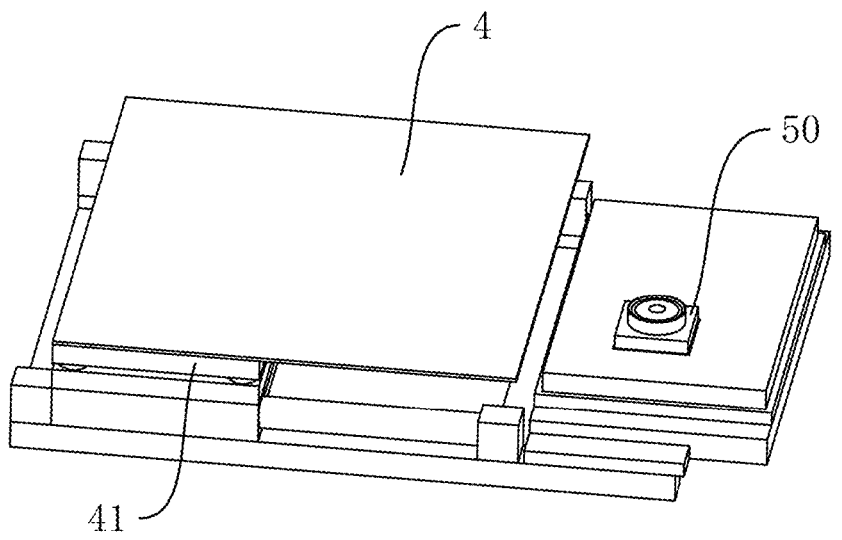
FIG. 9 is a diagram illustrating an embodiment of a first moving mechanical and a pressing plate of the test fixture of FIG. 4 according to the present disclosure.

Referring to FIGS. 5 and 9, in one embodiment, the test fixture further includes a pressure plate 4 and a first moving mechanism 41. There is a distance between the pressure plate 4 and the fixed base 1, the first moving mechanism 41 is disposed between the pressure plate 4 and the fixed base 1 and is connected with the pressure plate 4. The first moving mechanism 41 is configured to drive the pressure plate 4 to move to a specified position.

Figure 10:
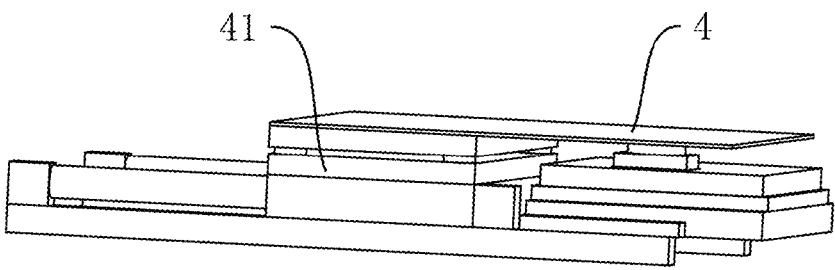
FIG. 10 is a diagram illustrating an embodiment of a pressing plate being pressed on a module of the test fixture of FIG. 4 according to the present disclosure.

Referring to FIGS. 5 and 10, in actual testing process, the module 50 is firstly disposed on the heat dispersion block 13, the first moving mechanism 41 drives the pressure plate 4 to move upon the module 50 and then drives the pressure plate 4 to be pressed down, until the pressure plate 4 moves to a first specified position. When the pressure plate 4 moves to the first specified position, the pressure plate 4 can press the module 50 from top down, the pressure plate 4 cooperates with the heat dispersion block 13 to tightly pressed the module 50. After the module 50 being tested, the first moving mechanism 41 drives the pressure 4 to rise, for releasing the pressure on the module 50.

It is understood that on the one hand the first moving mechanism 41 drives the pressure plate 4 to move, and on the other hand the first moving mechanism 41 provides the pressure for tightly pressed the module 50. In one embodiment, the first moving mechanism 41 is an electrical control device, the pressure provided by the first moving mechanism 41 is a system default value for providing a stable pressure by the pressure plate 4 to the module 50. The pressure can be set according to a hardware condition of the module 50 for decreasing a damage risk of the module 50 while being pressed caused by an excessive pressure.

In one embodiment, the first moving mechanism 41 includes a lateral moving device and a longitudinal moving device, both of which are cylinder driving devices for driving the pressure plate 4 to move laterally and longitudinally.

Before testing, the module 50 is disposed on the heat dispersion block 13 by a mechanical arm, and the pressure plate 4 is disposed on a side of the heat dispersion block 13 and is not directly above the heat dispersion block 13 for decreasing a space usage caused by placing the module 50. After the module 50 being disposed on the heat dispersion block 13, the lateral moving device drives the pressure plate 4 to move laterally to be directly above the module 50, and the longitudinal moving device drives the pressure plate 4 to press down. After the module 50 is completely tested, the longitudinal moving device drive the module to rise longitudinally, the lateral moving device drives the pressure plate 4 to move laterally at the original position, the module 50 being tested is removed from the heat dispersion block 13 by the mechanical arm, for executing the test for a next module 50.

Figure 11:
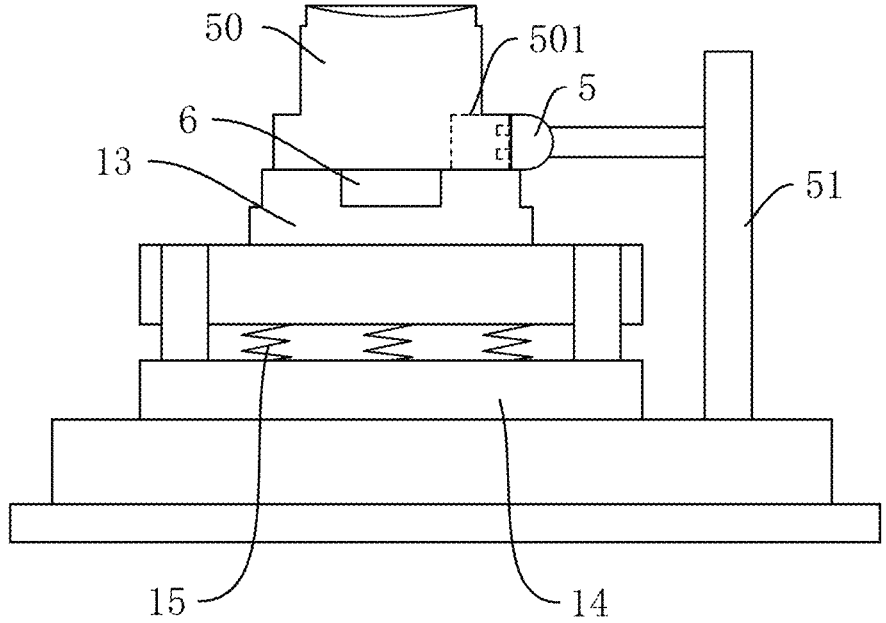
FIG. 11 is a diagram illustrating an embodiment of a test connector of the test fixture of FIG. 4 connected with the module according to the present disclosure.

Referring to FIGS. 5 and 11, in one embodiment, the test fixture further includes a test connector 5 and a second moving mechanism 51. There is a distance between the test connector 5 and the fixed base 1, the second moving mechanism 51 is disposed between the test connector 5 and the fixed base 1, the second moving mechanism 51 connects with the test connector 5. The test connector 5 is matched with an interface port 501 of the module 50 and provides a power to the interface port 501 when being connected with the interface port 501 for lighting the module 50 to work. The connection between the test connector 5 and the interface port 501 is a plug-in connection. The second moving mechanism 51 is used to drive the test connector 5 to move to a specified position.

Referring to FIGS. 10 and 11, in an actual testing process, the first moving mechanism 41 firstly drive the pressure plate 4 to press on the module 50 disposed on the heat dispersion block 13, and the second moving mechanism 51 drives the test connector 5 to move to a second specified position. When the test connector 5 moves at the second specified position, the test connector 5 is capable of powering the module 50 through the interface port 501, for testing features of the module 50. After the module 50 is completely tested, the second moving mechanism 51 drives the test connector 5 to away from the module 50 for disconnecting with the module 50, and the module 50 is powered off.

In one embodiment, the module 50 is a camera module. When the module 50 is normally lighted, a corresponding image is generated. By analyzing the image, a working performance of the module 50 is assessed.

It is understood that a moving direction and a type of the test connector 5 may be adjusted based on the interface port 501 of the module 50. In one embodiment, when the interface port 501 of the module 50 is faced up, and the test connector 5 may refer the moving direction of the pressure plate 4. After being moved directly over the interface port 501, the test connector 5 moves down to the second specified position.

Referring to FIGS. 5 and 8, in one embodiment, the test fixture further includes a pressure sensing module 6. The pressuring sensing module 6 is configured to sense a pressure on the module 50 while being pressed by the pressure plate 4.

In detail, the heat dispersion block 13 defines a receiving hole 16. The pressure sensing module 6 is mounted and received in the receiving hole 16. The receiving hole 16 communicates with the surface of the fixed base 1 adjacent to the testing position 11, which is the surface of the fixed base 1 adjacent to the module 50. A detecting end of the pressure sensing module 6 is exposed from the receiving hole 16.

In one embodiment, the detecting end of the pressure sensing module 6 is exposed from a top end of the receiving hole 16. When being disposed on the test position 11, the module 50 is disposed on the detecting end of the pressure sensing module 6, the pressure sensing module 6 senses the pressure value on the module 50. The pressure value on the module 50 is a pressure provided by the pressure plate 4, which is the specified value under a normal condition. Thus, when the detected pressure value is abnormal, it is determined that the elastic components 15 of the fixed base 1 is abnormal, for example, some of the elastic components 15 have no bounce, which cause the pressure on the heat dispersion block 13 to become uneven.

For determining whether the pressure value detected by the pressure sensing module 6 is abnormal, a pressure threshold range is set for determining. When the pressure value is beside the pressure threshold range, the pressure value is determined to be abnormal. A plurality of pressure values may be sensed for analyzing, for example, when there are a plurality of the test fixtures works at the same time, a discrete analysis is provided for analyzing the pressure values of each test fixture. When some of the pressure values is distracted from other pressure values, the distracted pressure values are determined to be abnormal.

Referring to FIGS. 5 and 8 again, in one embodiment, the test fixture further includes a temperature sensing module 7. The temperature sensing module 1 is configured to sense a temperature value of the module 50 while being lighted.

In detail, the temperature sensing module 7 is mounded and received in the receiving hole 16. A detecting end of the temperature sensing module 7 is exposed from the receiving hole 16. When being disposed on the test position 11, the module 50 is disposed on the detecting end of the temperature sensing module 7 for sensing the temperature value of the module 50. The module 50 generates heat while being lighted, which may be effect to other electrical components in the test fixture. Thus, when the temperature value detected by the temperature sensing module 7 is abnormal, it is determined that the module 50 is abnormal or the temperature in the test fixture is abnormal, a check or a repair needs to be provided in time.

For determining whether the temperature value detected by the temperature sensing module 7 is abnormal, a temperature threshold range is set for determining. When the temperature value is besides the temperature threshold range, the temperature value is determined to be abnormal. A plurality of temperature values may be sensed for analyzing, for example, when there are a plurality of the test fixtures works at the same time, a discrete analysis is provided for analyzing the temperature values of each test fixture. When some of the temperature values is distracted from other temperature values, the distracted temperature values are determined to be abnormal.

In one embodiment, the pressure sensing module 6 and the temperature sensing module 7 may be integrated into a micro pressure and temperature complex sensor 8. The micro pressure and temperature complex sensor 8 provides functions of pressure detecting and temperature detecting. The micro pressure and temperature complex sensor 8 is received in the receiving hole 16.

Referring to FIGS. 4 and 5 again, in one embodiment, the receiving hole 16 is disposed at a center of the fixed base 1, the threading needle holes 12 surrounding the receiving hole 16 are evenly distributed around the circumference. Correspondingly, the probes 2 surrounding the receiving hole 16 are evenly distributed around the circumference.

In one embodiment, in a natural state, that is the module 50 is not disposed on the test position 11, a height of the top end of the probe 2 is larger than a height of the detecting end of the pressure sensing module 6. When the module 50 is disposed on the test position 11, the module 50 firstly contacts with the probes 2 and then contacts with the pressure sensing module 6. The probes 2 are compressed and act as a cushion for making the module 50 to be steadily disposed on the pressure sensing module 6. The stability of the module 50 is improved while testing the pressure of the module 50. The pressure sensing module 6 supports the module 50 for decreasing a pressure of the module 50 to the probes 2 and the wear of the module 50.

In one embodiment, there is space between an inner surface of the receiving hole 16 and an outer surface of the pressure sensing module 6, and an insulation region is formed between the receiving hole 16 and the pressure sensing module 6 for decreasing physical effect and signal interference of the heat of the heat dispersion block 13 to the pressure sensing module 6. There is a space between the inner surface of the receiving hole 16 and the temperature sensing module 7, and an insulation region is formed between the receiving hole 16 and the temperature sensing module 7 for decreasing physical effect and signal interference of the heat of the heat dispersion block 13 to the temperature sensing module 7.

In one embodiment, there is a space between the inner surface of the receiving hole 16 and the micro pressure and temperature complex sensor 8 for achieving above effects.

In one embodiment, there is a space between an inner surface of the threading needle hole 12 and an outer surface of the probe 2 and an insulation region is formed between the threading needle hole 12 and the probe 2 for decreasing physical effect and signal interference of the heat of the heat dispersion block 13 to the probe 2.

The present disclosure provides a test fixture. When the module 50 is disposed on the fixed base 1, the probes 2 are directly contact with the module 50 for testing, the gilded block between the module 50 and the probes 2 is removed for increasing the stability and accuracy of the test results.

In other hands, the test fixture uses the pressure sensing module 6 to detect a pressure provided to the module 50 for decreasing a risk of losing elastic force of the elastic components 15 of the test fixture after being used for a long time.

The test fixture uses the heat dispersion block 13 to disperse the heat generated by the module 50 while being lighted for decreasing an effect of the heat one the image. Also, the test fixture uses the temperature sensing module 7 to detect the temperature value for accurately monitoring the temperature.

The test fixture of the present disclosure is not limited to test the impedance, the pressure, and the temperature, but also may use to test other features by setting corresponding sensors due to the test requirements. The structure of the test fixture also may be used in other fixtures.

Figure 12:
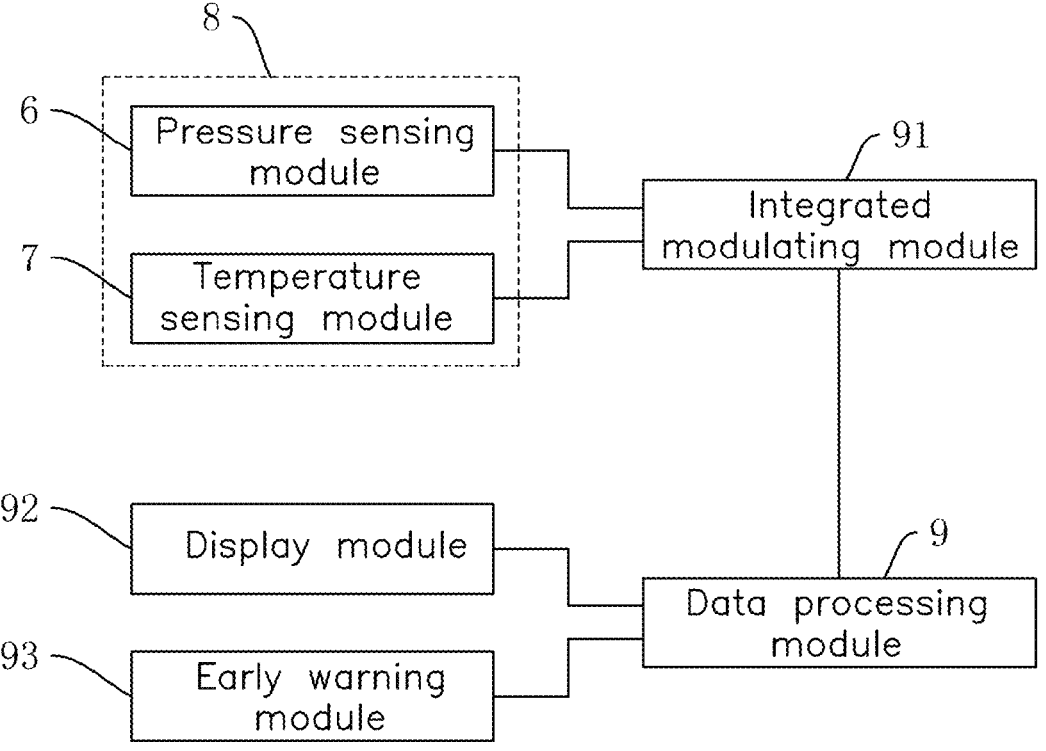
FIG. 12 is a diagram illustrating an embodiment of an early warning system according to the present disclosure.

Referring to FIG. 12, FIG. 12 shows an early warning system. The early warning system includes the above test fixture. The early warning system further includes a data processing module 9, an integrated modulating module 91, a display module 92, and an early warning module 93.

The test fixture, the integrated modulating module 91, the display module 92, and the early warning module 93 are electrically connected with the data processing module 9. The sensors in the test fixture are electrically connected with the data processing module 9 for establishing the electrical connection between the test fixture and the data processing module 9.

In detail, the tester 3, the pressure sensing module 6, and the temperature sensing module 7 are electrically connected with the integrated modulating module 91, and the data processing module 9 is electrically connected with the integrated modulating module 91.

The integrated modulating module 91 receives the test result of the tester 3, the pressure sensing module 6, and the temperature sensing module 7, and executes a conversion of analog signals and digital signal of the test result. The converted test results are transmitted to the data processing module 9. The data processing module 9 processes and analyzes the converted test result when receiving the converted test result.

In one embodiment, the display module 92 can be an LCD display screen. The data processing module 9 transmits the converted test result to the display module 92, and the display module 92 displays corresponding parameters in the test result in real time.

The display module 92 displays data obtained by testing the module 50 with the test fixture. The parameters displayed on the display module 92 can be set by test items of the test fixture. In one embodiment, the test fixture can test the impedance, the pressure, and the temperature of the module 50, and the parameters displayed on the display module 92 can be one or a combination of the impedance, the pressure, and the temperature.

In one embodiment, the data processing module 9 analyzes the test results after receiving the test results. Each parameter in the test results corresponds to a specified threshold value. If the parameter exceeds the corresponding specified threshold value, the data processing module 9 generates a warning signal to the early warning module 93. The early warning module 93 executes a warning operation in response to the warning signal.

It is understood that the early warning module 93 is used to generate a warning when the test results of testing the module 50 by the test fixture are deviated from expected values, and managers are reminded to check the test results. Parameters warned by the early warning module 93 can be set according to the test items of the test fixture.

In one embodiment, the test fixture can test the impedance, the pressure, and the temperature of the module 50, and the data processing module 9 can generates a impedance warning signal when the impedance exceeds the impedance threshold value, or generates a pressure warning signal when the pressure value exceeds the corresponding pressure threshold value, or generates a temperature warning signal when the temperature value exceeds the corresponding temperature threshold value.

In detail, the warning operation of the early warning module 93 can be a flashed light, a warning interface displayed in the display interface, a beep, or the warning signal transmitted to a manager terminal. In one embodiment, when the pressure or the temperature exceeds the corresponding threshold value, the corresponding parameter in the display module 92 is displayed in red.

The implementation principle and the beneficial effect of the early warning system of the present disclosure can refer to the detail description of the test fixture. Details are not described herein again.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test fixture comprises:
a fixed base, configured to place a module, the fixed base defines threading needle holes, the threading needle holes communicates with a surface of the fixed base adjacent to the module; and
probes, connected with a tester, the probes extend through the threading needle holes to contact with the module placed on the fixed base, the tester is capable of testing the module;
wherein the test fixture further comprises:

a test connector, distanced from the fixed base; the test connector is configured to connect with an interface port of the module; and a second moving mechanism, connected with the test connector, the second moving mechanism is configured to drive the test connector to move to a second specified position, wherein the test connector is connectable with the interface port at the second specified position.

2. The test fixture of claim 1, wherein the test fixture further comprises:

a pressure plate, distanced from the fixed base; and a first moving mechanism, connected with the pressure plate, the first moving mechanism configured to drive the pressure plate to move to a first specified position for cooperating with the fixed base to tightly press the module.

3. The test fixture of claim 2, wherein the fixed base comprises a heat dispersion block, a base, and elastic components; the heat dispersion block is adjacent to the module; the threading needle holes are disposed in the heat dispersion block; there is a space between the heat dispersion block and the base, and the heat dispersion block is in a slip connection with the base; the elastic components are disposed between the heat dispersion block and the base.

4. The test fixture of claim 2, wherein the test fixture further comprises a pressure sensing module configured to detect a pressure value on the module when the pressure plate and the fixed base cooperate with each other to press the module.

5. The test fixture of claim 4, wherein the fixed base defines a receiving hole; the pressure sensing module is received in the receiving hole.

6. The test fixture of claim 1, wherein the test fixture further comprises a temperature sensing module; the temperature sensing module is configured to detect a temperature value of the module when the test connector is connected with the interface port.

7. The test fixture of claim 1, wherein the fixed base further comprises a heat dispersion block, a base, and elastic components; the heat dispersion block is adjacent to the module; the threading needle holes are disposed in the heat dispersion block; the threading needle holes and the heat dispersion block are fixed on the base.

8. An early warning system comprises:

a data processing module;

an early warning module; and a test fixture;

wherein the test fixture comprises:

a fixed base, configured to place a module, the fixed base defines threading needle holes, the threading needle holes communicates with a surface of the fixed base adjacent to the module;

probes, connected with a tester, the probes extend through the threading needle holes to contact with the module placed on the fixed base, the tester is capable of testing the module;

a test connector, distanced from the fixed base; the test connector is configured to connect with an interface port of the module; and a second moving mechanism, connected with the test connector, the second moving mechanism is configured to drive the test connector to move to a second specified position;

wherein the test connector is connectable with the interface port at the second specified position.

9. The early warning system of claim 8, wherein the test fixture further comprises:

a pressure plate, distanced from the fixed base; and a first moving mechanism, connected with the pressure plate, the first moving mechanism configured to drive the pressure plate to move to a first specified position for cooperating with the fixed base to tightly press the module.

10. The early warning system of claim 9, wherein the fixed base comprises a heat dispersion block, a base, and elastic components; the heat dispersion block is adjacent to the module; the threading needle holes are disposed in the heat dispersion block; there is a space between the heat dispersion block and the base, and the heat dispersion block is in a slip connection with the base; the elastic components are disposed between the heat dispersion block and the base.

11. The early warning system of claim 9, wherein the test fixture further comprises a pressure sensing module; the pressure sensing module is configured to detect a pressure value on the module when the pressure plate and the fixed base cooperate with each other to press the module.

12. The early warning system of claim 11, wherein the fixed base defines a receiving hole; the pressure sensing module is received in the receiving hole.

13. The early warning system of claim 8, wherein the test fixture further comprises a temperature sensing module received in the receiving hole; the temperature sensing module is configured to detect a temperature value of the module when the test connector is connected with the interface port.

14. The early warning system of claim 8, wherein the fixed base further comprises a heat dispersion block, a base, and elastic components; the heat dispersion block is adjacent to the module; the threading needle holes are disposed in the heat dispersion block; the threading needle holes and the heat dispersion block are fixed on the base.

15. The early warning system of claim 14, wherein there is space between an inner surface of the receiving hole and an outer surface of the pressure sensing module, and an insulation region is formed between the receiving hole and the pressure sensing module for decreasing physical effect and signal interference of heat of the heat dispersion block to the pressure sensing module.

16. The early warning system of claim 14, wherein there is space between an inner surface of the receiving hole and an outer surface of the temperature sensing module, and an insulation region is formed between the receiving hole and the temperature sensing module for decreasing physical effect and signal interference of heat of the heat dispersion block to the temperature sensing module.

17. The early warning system of claim 12, wherein the receiving hole is disposed at a center of the fixed base, the threading needle holes surrounding the receiving hole are evenly distributed around the circumference; the probes surrounding the receiving hole are evenly distributed around the circumference.

* * * * *